US009564293B2

(12) United States Patent
Yashima et al.

(10) Patent No.: US 9,564,293 B2
(45) Date of Patent: Feb. 7, 2017

(54) CHARGED PARTICLE BEAM WRITING APPARATUS, AND BUFFER MEMORY DATA STORAGE METHOD

(71) Applicant: NuFlare Technology, Inc., Yokohama (JP)

(72) Inventors: Jun Yashima, Kanagawa (JP); Yasuo Kato, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 218 days.

(21) Appl. No.: 14/177,489

(22) Filed: Feb. 11, 2014

(65) Prior Publication Data

US 2014/0237196 A1     Aug. 21, 2014

(30) Foreign Application Priority Data

Feb. 18, 2013 (JP) .................................. 2013-028504

(51) Int. Cl.
*G06F 12/00*     (2006.01)
*H01J 37/317*    (2006.01)
*G06F 3/06*      (2006.01)

(52) U.S. Cl.
CPC ......... *H01J 37/3174* (2013.01); *G06F 3/0631* (2013.01); *G06F 3/0644* (2013.01); *H01J 2237/30416* (2013.01)

(58) Field of Classification Search
CPC ............. G06F 3/0628–3/0634; G06F 12/0893; G06F 3/0644

(Continued)

(56) References Cited

U.S. PATENT DOCUMENTS

| 4,534,016 A * | 8/1985 | Kirkpatrick | G11B 9/10 365/128 |
| 2010/0180209 A1* | 7/2010 | Yang | G06F 1/266 715/748 |
| 2011/0012031 A1* | 1/2011 | Shibata | B82Y 10/00 250/492.3 |

FOREIGN PATENT DOCUMENTS

| JP | S63-081819 | 4/1988 |
| JP | 64-76660 | 3/1989 |

(Continued)

OTHER PUBLICATIONS

Office Action issued in Korean Patent Application No. 10-2014-0017905 (with English translation).

(Continued)

*Primary Examiner* — Prasith Thammavong
(74) *Attorney, Agent, or Firm* — Oblon, McClelland, Maier & Neustadt, L.L.P.

(57) ABSTRACT

A charged particle beam writing apparatus includes a buffer memory including a memory region capable of contemporarily storing writing data for data processing regions, wherein writing data including data files is temporarily stored for each of the data processing regions, a dividing unit to divide the memory region of the buffer memory into a first region being large and a second region being small, a specifying unit to specify the memory region such that a data file being large is preferentially stored in the first region and a data file being small is stored at least in the second region, concerning the data files for each of the data processing regions included in the writing data, and a data processing unit to read data files corresponding to each of the data processing regions from the buffer memory, and to perform data processing using the read data files.

12 Claims, 7 Drawing Sheets

(58) Field of Classification Search
USPC .......................................................... 711/153
See application file for complete search history.

(56) References Cited

FOREIGN PATENT DOCUMENTS

| | | |
|---|---|---|
| JP | 9-83771 | 3/1997 |
| JP | 2003-248834 | 9/2003 |
| JP | 2011-34510 | 2/2011 |

OTHER PUBLICATIONS

Japanese Office Action dated Oct. 25, 2016, issued in Japanese Patent Application No. 2013-028504 (with English translation).

* cited by examiner

CHARGED PARTICLE BEAM WRITING APPARATUS, AND BUFFER MEMORY DATA STORAGE METHOD

CROSS-REFERENCE TO RELATED APPLICATION

This application is based upon and claims the benefit of priority from the prior Japanese Patent Application No. 2013-028504 filed on Feb. 18, 2013 in Japan, the entire contents of which are incorporated herein by reference.

BACKGROUND OF THE INVENTION

Field of the Invention

The present invention relates to a charged particle beam writing apparatus and a buffer memory data storage method. More specifically, for example, the present invention relates to a writing apparatus that performs data processing for each processing region by inputting writing data into a buffer memory, and a method therefor.

Description of Related Art

The lithography technique that advances miniaturization of semiconductor devices is extremely important as being a unique process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a high-precision master pattern.

FIG. 9 is a conceptual diagram for explaining operations of a variable shaped electron beam writing or "drawing" apparatus. As shown in the figure, the variable shaped electron beam writing apparatus operates as described below. A first aperture 410 has a quadrangular opening 411 for shaping an electron beam 330. A second aperture 420 has a variable-shape opening 421 for shaping the electron beam 330 having passed through the opening 411 of the first aperture 410 into a desired quadrangular shape. The electron beam 330 emitted from a charged particle source 430 and having passed through the opening 411 is deflected by a deflector to pass through a part of the variable-shape opening 421 of the second aperture 420, and thereby to irradiate a target object or "sample" 340 placed on a stage which continuously moves in one predetermined direction (e.g., the x direction) during the writing. In other words, a quadrangular shape that can pass through both the opening 411 and the variable-shape opening 421 is used for pattern writing in a writing region of the target object 340 on the stage continuously moving in the x direction. This method of forming a given shape by letting beams pass through both the opening 411 of the first aperture 410 and the variable-shape opening 421 of the second aperture 420 is referred to as a variable shaped beam (VSB) system.

When reading writing data in which positions, shapes, etc. of patterns to be written are defined into a memory in a writing apparatus, generally, the data is sorted and stored in a memory region (memory space) by a commercial operating system (OS) that controls the control computer. Then, in the processing side wherein data processing is performed, data is read from the memory and conversion of the data is performed to generate data required for writing processing. In the writing apparatus, in parallel with an actual writing operation irradiating electron beams, data processing for a next writing processing region is executed in real time. In the system side, when the amount of memory used exceeds a specified amount, data not being used at the time is deleted from the memory by a garbage collection function performed by the OS. Then, next data is sequentially stored in an empty region. In recent years, the number of patterns written is increased, and their shapes are various. If data of such patterns is read into the memory by the OS control, fragmentation may occur in the memory. Furthermore, if the memory capacity becomes insufficient, the OS performs a swap-out by using the hard disk etc.

As described above, when memory control is performed by the OS, fragmentation or swap-out is performed in the memory. This causes a problem that when data processing is performed in the processing side, the data read-out time becomes long and the data processing speed of writing data is deceased. Accordingly, a problem occurs that data processing itself may be stopped in some cases, thereby causing a stop of writing processing.

BRIEF SUMMARY OF THE INVENTION

In accordance with one aspect of the present invention, a charged particle beam writing apparatus includes a buffer memory configured to include a memory region capable of contemporarily storing writing data for a plurality of data processing regions obtained by virtually dividing a writing region to be written, wherein writing data including a plurality of data files is temporarily stored for each of the plurality of data processing regions; a dividing unit configured to divide the memory region of the buffer memory into a first region whose region size is large and a second region whose region size is small; a region specifying unit configured to specify the memory region of the buffer memory such that a data file whose file size is large has priority to be stored in the first region and a data file whose file size is small is stored at least in the second region, with respect to the plurality of data files for the each of the plurality of data processing regions included in the writing data; a data processing unit configured to read the plurality of data files corresponding to the each of the plurality of data processing regions from the buffer memory, and to perform data processing using the plurality of data files having been read; and a writing unit configured to write a pattern on a target object with charged particle beams, in accordance with content of the data processing, for the each of the plurality of data processing regions.

In accordance with another aspect of the present invention, a method of storing data in a buffer memory includes dividing a memory region of a buffer memory, which can contemporarily store writing data for a plurality of data processing regions obtained by virtually dividing a writing region to be written, wherein writing data including a plurality of data files is temporarily stored for each of the plurality of data processing regions, into a first region whose region size is large and a second region whose region size is small; specifying the memory region of the buffer memory such that a data file whose file size is large has priority to be stored in the first region and a data file whose file size is small is stored at least in the second region, with respect to the plurality of data files for the each of the plurality of data processing regions included in the writing data; and storing, for the each of the plurality of data processing regions, the plurality of data files respectively in a specified memory region in the memory region of the buffer memory.

DETAILED DESCRIPTION OF THE INVENTION

In the following embodiments, there will be described a writing apparatus and method that can suppress fragmentation or swapping out in a memory.

Moreover, in the following embodiments, there will be described a configuration in which an electron beam is used as an example of a charged particle beam. However, the charged particle beam is not limited to the electron beam, and other charged particle beam such as an ion beam may also be used. Moreover, a variable shaped beam type writing apparatus will be described as an example of a charged particle beam apparatus.

First Embodiment

Figure 1:
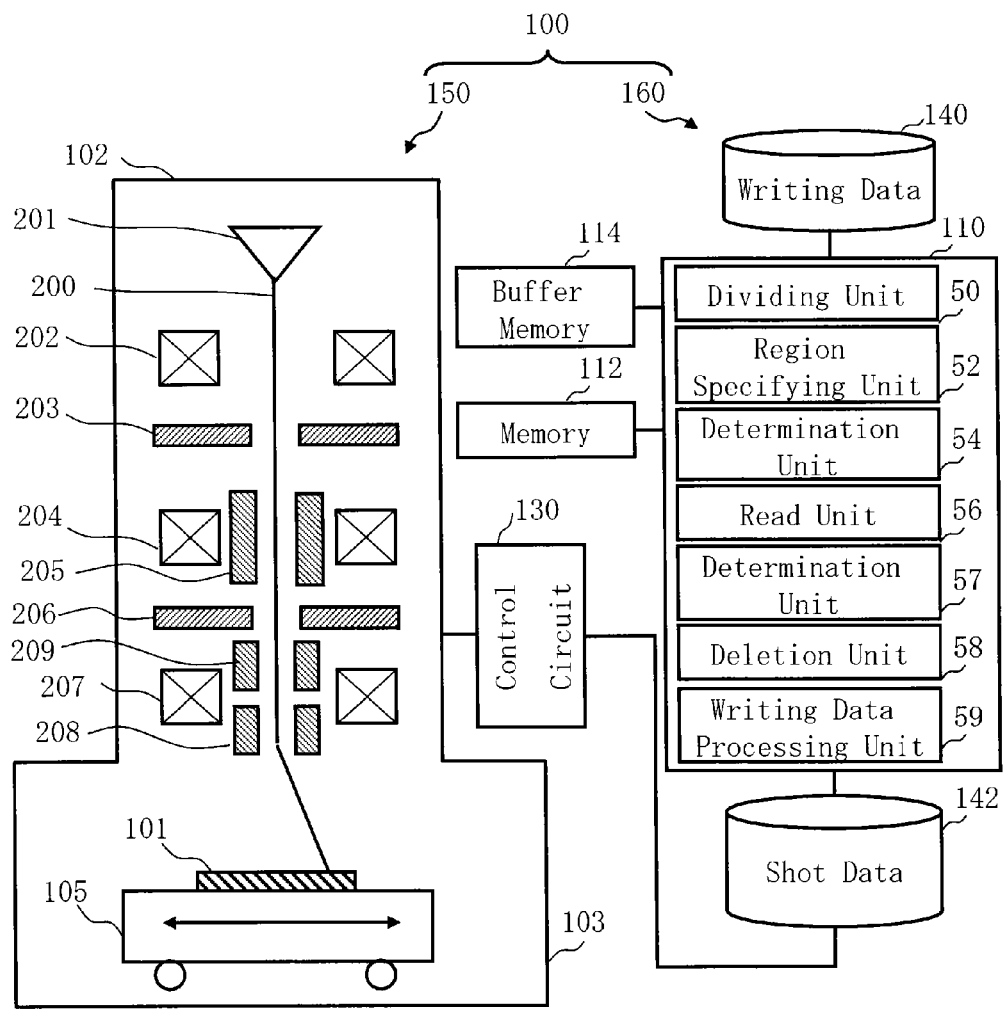
FIG. 1 is a schematic diagram showing a configuration of a writing apparatus according to the first embodiment.

FIG. 1 is a schematic diagram showing the configuration of a writing apparatus according to the first embodiment. In FIG. 1, a writing (or "drawing") apparatus 100 includes a writing unit 150 and a control unit 160. The writing apparatus 100 is an example of a charged particle beam writing apparatus, and, particularly, it is an example of a variable shaped beam (VSB) type writing apparatus. The writing unit 150 includes an electron lens barrel 102 and a writing chamber 103. In the electron lens barrel 102, there are arranged an electron gun assembly 201, an illumination lens 202, a first aperture 203, a projection lens 204, a deflector 205, a second aperture 206, an objective lens 207, a main deflector 208, and a sub deflector 209. In the writing chamber 103, there is arranged an XY stage 105, on which a target object or "sample" 101 such as a mask serving as a writing target substrate is placed when performing writing. The target object 101 is, for example, an exposure mask used for manufacturing semiconductor devices. The target object 101 may be, for example, a mask blank on which resist is applied and no pattern has yet been formed.

The control unit 160 includes a control computer 110, a memory 112, a buffer memory 114, a control circuit 130, and storage devices 140 and 142, such as magnetic disks. The control computer 110, the memory 112, the buffer memory 114 the control circuit 130, and the storage devices 140 and 142 are mutually connected through a bus (not shown).

In the control computer 110, there are arranged a dividing unit 50, a region specifying unit 52, a determination unit 54, a read unit 56, a determination unit 57, a deletion unit 58, and a writing data processing unit 59. Each function, such as the dividing unit 50, the region specifying unit 52, the determination unit 54 the read unit 56, the determination unit 57, the deletion unit 58, and the writing data processing unit 59 may be configured by hardware such as an electronic circuit or by software such as a program causing a computer to implement these functions. Alternatively, it may be configured by a combination of hardware and software. Data which is input and output to/from the dividing unit 50, the region specifying unit 52, the determination unit 54 the read unit 56, the determination unit 57, the deletion unit 58, and the writing data processing unit 59 and data being calculated are stored in the memory 112 each time.

FIG. 1 shows a configuration necessary for explaining the first embodiment. Other configuration elements generally necessary for the writing apparatus 100 may also be included. For example, although a multiple stage deflector of two stages of the main deflector 208 and the sub deflector 209 is herein used for position deflection, a single stage deflector or a multiple stage deflector of three or more stages may also be used for position deflection.

In the storage device 140 (storage unit), there is stored chip data (writing data) of a chip including a plurality of cells each configured by at least one figure pattern, input from the outside the apparatus. Each figure pattern data indicating the shape, arrangement coordinates and size of each figure pattern is defined in the chip data. In other words, each figure pattern data indicating the shape, arrangement coordinates and size of each figure pattern in a chip including a plurality of figure patterns is defined in the chip data.

Figure 2:
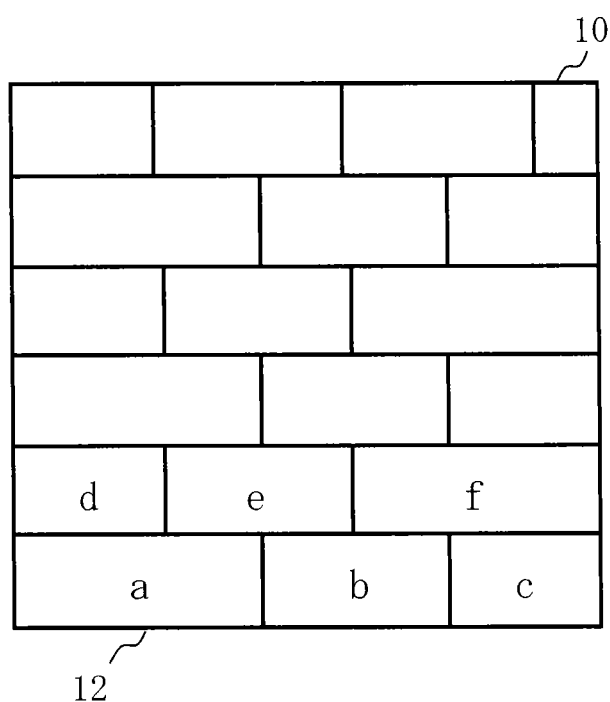
FIG. 2 shows an example of a chip region and its processing region according to the first embodiment.

FIG. 2 shows an example of a chip region and its processing region according to the first embodiment. In FIG. 2, a chip region 10 (writing region) serving as a writing target is virtually divided into a plurality of frame regions 12 (data processing region). The size of each frame region 12 may be the same or different from each other as shown in FIG. 2. For example, it is preferable to vary the size of each frame region 12 according to an amount of data. The writing data described above is composed of a plurality of data files for each frame region 12, for example. A cell pattern data file, a position data file, and a link file are cited as a plurality of data files of each frame region 12. It is also preferable to provide a common cell pattern data file separately with respect to a cell pattern referred to in a plurality of frame regions 12. In the cell pattern data file, there is defined pattern data of a cell pattern configured by at least one figure. In the position data file, there is defined position data indicating a position (coordinates) of each cell pattern. In the link file, there is defined link information for linking position data and its corresponding pattern data. Since the cell pattern data file defines the figure type, size, etc. of a figure composing each cell, its data size (amount of data) is very large compared with the position data file defining coordinates and the link file defining link information (e.g., an identifier).

In the writing apparatus 100, a plurality of data files corresponding to each frame region 12 are temporarily stored in the buffer memory 114, for example. Then, in the writing data processing unit 59, data is read from the buffer memory 114 and conversion of the data is performed to generate data required for writing processing. According to the first embodiment, the memory region (memory space) of the buffer memory 114 is not controlled by a general commercial operating system (OS) that controls a control computer, but is managed and controlled by a configuration arranged specially in the control computer 110.

Figure 3:
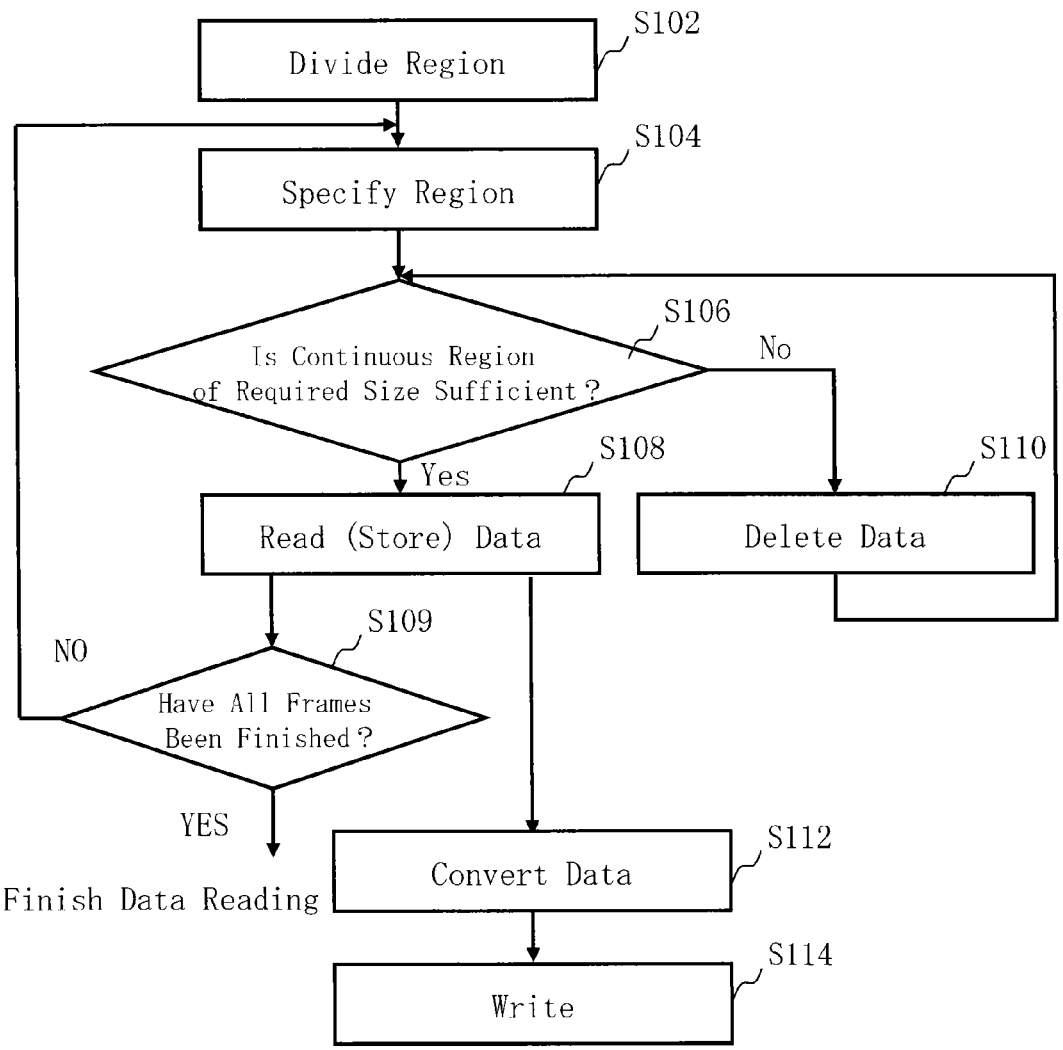
FIG. 3 is a flowchart showing main steps of a writing method according to the first embodiment.

FIG. 3 is a flowchart showing main steps of a writing method according to the first embodiment. In FIG. 3, the writing method according to the first embodiment executes a series of steps: a region dividing step (S102), a region specifying step (S104), a determination step (S106), a data read step (S108), a determination step (S109), a data deletion step (S110), a data conversion processing step (S112), and a writing step (S114). In these steps, the region dividing step (S102), the region specifying step (S104), the determination step (S106), the data read step (S108), the determination step (S109), and the data deletion step (S110) are executed as a data storage method of the buffer memory according to the first embodiment.

In the region dividing step (S102), the dividing unit 50 divides the memory region (memory space) of the buffer memory 114 into a large data size region (first region) whose region size is large and a small data size region (second region) whose region size is small.

Figure 4:
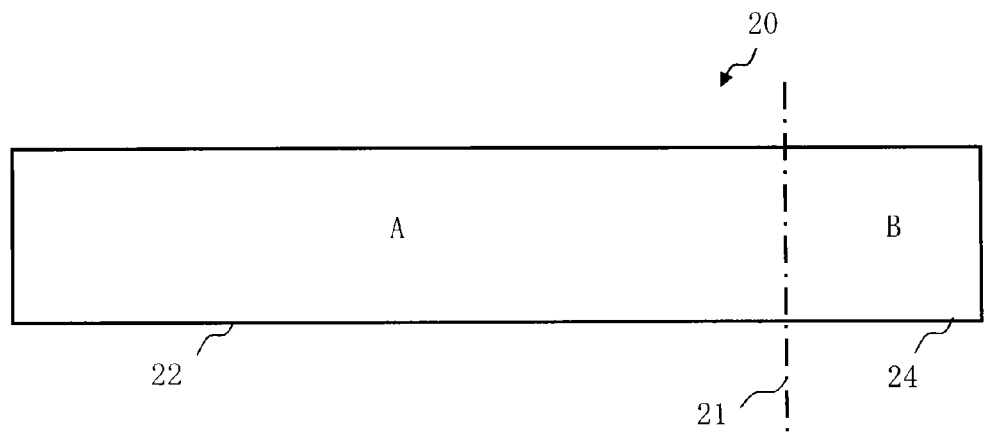
FIG. 4 is a conceptual diagram showing a memory region of a buffer memory according to the first embodiment.

FIG. 4 is a conceptual diagram showing a memory region of a buffer memory according to the first embodiment. As shown in FIG. 4, a memory region 20 (memory space) of the buffer memory 114 is divided into two, a large data size region 22 (A) and a small data size region 24 (B), based on a dividing position 21. The memory region 20 of the buffer memory 114 has a size that can contemporarily store writing data for a plurality of frame regions 12. That is, the memory region 20 has an area for storing data for a plurality of frame regions 12. It is effectively preferable for the memory region 20 to have an area for at least three frame regions. It is preferable that a threshold value (the dividing position 21) for dividing the memory region 20 into the large data size region 22 and the small data size region 24 is determined by using the ratio of the file sizes of a plurality of data files. Specifically, first, the ratio of the file sizes of the cell pattern data file, the position data file and the link file is obtained. For example, if the ratio of the sizes of the cell pattern data file, the position data file, and the link file is 10:1:1, a continuous region of $^{10}/_{12}$ (ten twelfths) of the memory region 20 is assigned as the large data size region 22, and a continuous remaining region of $^{2}/_{12}$ is assigned as the small data size region 24. In that case, it is preferable that the dividing position 21 is adjusted so that a cell pattern data file for at least two frame regions may be stored in the large data size region 22. More preferably, the dividing position 21 is adjusted so that a cell pattern data file for three frame regions may be stored. For example, the dividing position 21 obtained based on the ratio of the file sizes of a plurality of data files may be offset by an amount α with respect to the side of the large data size region 22 such that a cell pattern data file for at least two frame regions is stored. If ratios of the file sizes of a plurality of data files are various depending upon the frame regions 12, it is also preferable to use an average value of the ratios of a plurality of frame regions 12. For example, the average value of ratios of the file sizes of a plurality of data files for two frame regions may be used.

In the region specifying step (S104), with respect to writing data including a plurality of data files for each frame region 12, the region specifying unit 52 specifies the memory region 20 of the buffer memory 114 such that a cell pattern data file whose file size is large is given priority to be stored in the large data size region 22 and a position data file and a link file whose file sizes are small are stored at least in the small data size region 24.

In the determination step (S106), the determination unit 54 determines whether a continuous region whose size is greater than or equal to the required size can be acquired in a specified region in the buffer memory 114. In other words, it is determined whether a continuous empty region whose size is greater than or equal to the size necessary for storing a plurality of data files of the frame region 12 concerned can be acquired in a specified region in the buffer memory 114. If it is impossible to acquire a continuous region greater than or equal to the required size, it proceeds to the data deletion step (S110). If it is possible to acquire a continuous region greater than or equal to the required size, it proceeds to the data read step (S108).

In the data read step (S108), with respect to each frame region 12, the read unit 56 reads and stores a plurality of data files (a cell pattern data file, a position data file, and a link file) respectively to a region specified in the memory region 20 of the buffer memory 114.

Figure 5:
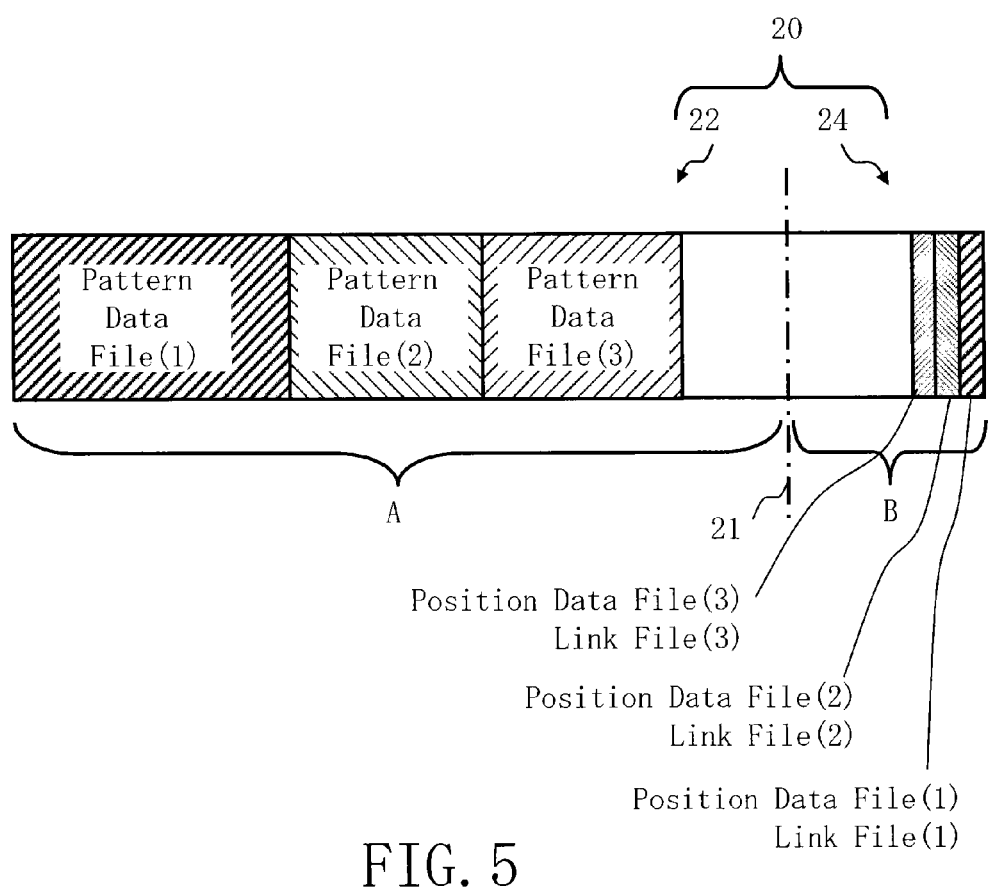
FIG. 5 is a conceptual diagram showing a memory region of a buffer memory according to the first embodiment.

FIG. 5 is a conceptual diagram showing a memory region of a buffer memory according to the first embodiment. In the example of FIG. 5, it starts to store the cell pattern data file (1) of the first frame region 12 from the end side (the opposite side to the dividing position 21 side) of the large data size region 22. It also starts to store the position data file (1) and link file (1) of the first frame region 12 from the end side (the opposite side to the dividing position 21 side) of the small data size region 24. It is preferable to store the position data file (1) and the link file (1) to be continuous with each other, and the order of storing them is not particularly limited. By the method of starting storing the files from the end side in order, the storage region of a subsequent data file can be acquired.

In the determination step (S109), the determination unit 57 determines whether file data has been stored with respect to all the frame regions 12. If storing file data has not been completed with respect to all the frame regions 12, it returns to the region specifying step (S104) and repeats the steps in order from the region specifying step (S104) to the determination step (S109) for subsequent frame regions until storing file data has been completed with respect to all the frame regions 12. In that case, it should be understood that the data deletion step (S110) described later is also carried out according to the existence or nonexistence of an empty continuous region of the required size in the memory region.

In the example of FIG. 5, the cell pattern data file (1) of the first frame region 12, the cell pattern data file (2) of the second frame region 12, and the cell pattern data file (3) of the third frame region 12 are stored in order from the end side of the large data size region 22. Also, the position data file (1) and link file (1) of the first frame region 12, the position data file (2) and link file (2) of the second frame region 12, and the position data file (3) and link file (3) of the third frame region 12 are stored in order from the end side of the small data size region 24.

Figure 6A:
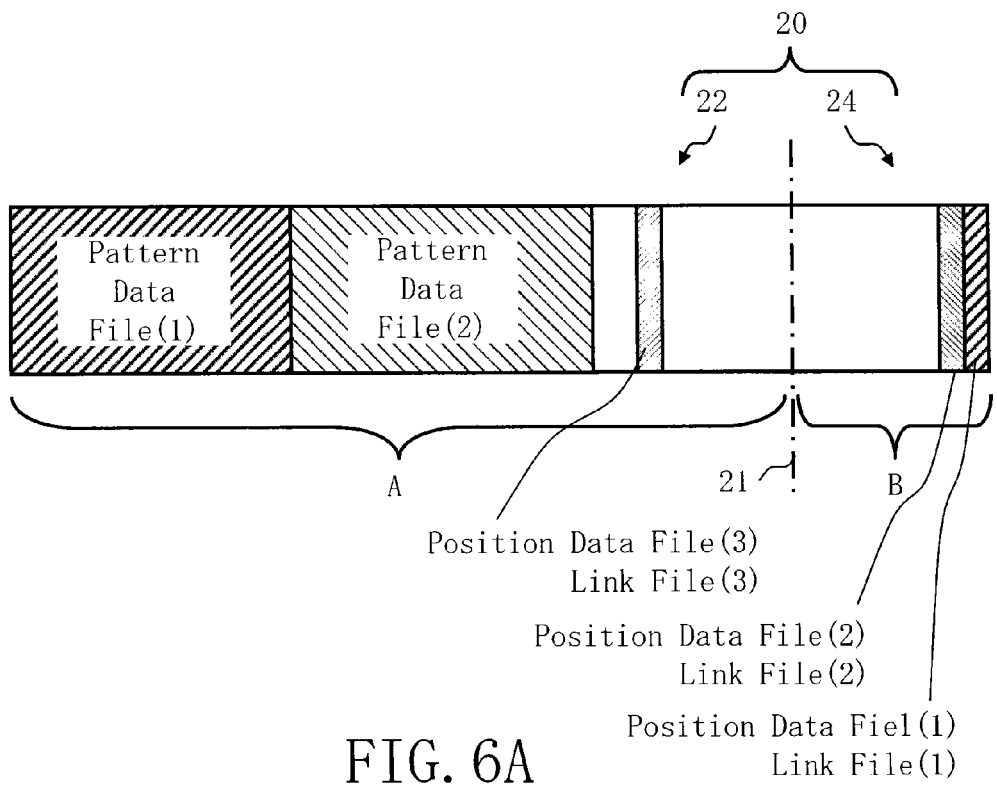
FIGS. 6A and 6B are conceptual diagrams for explaining a method of storing data into a buffer memory according to the first embodiment.
Figure 6B:
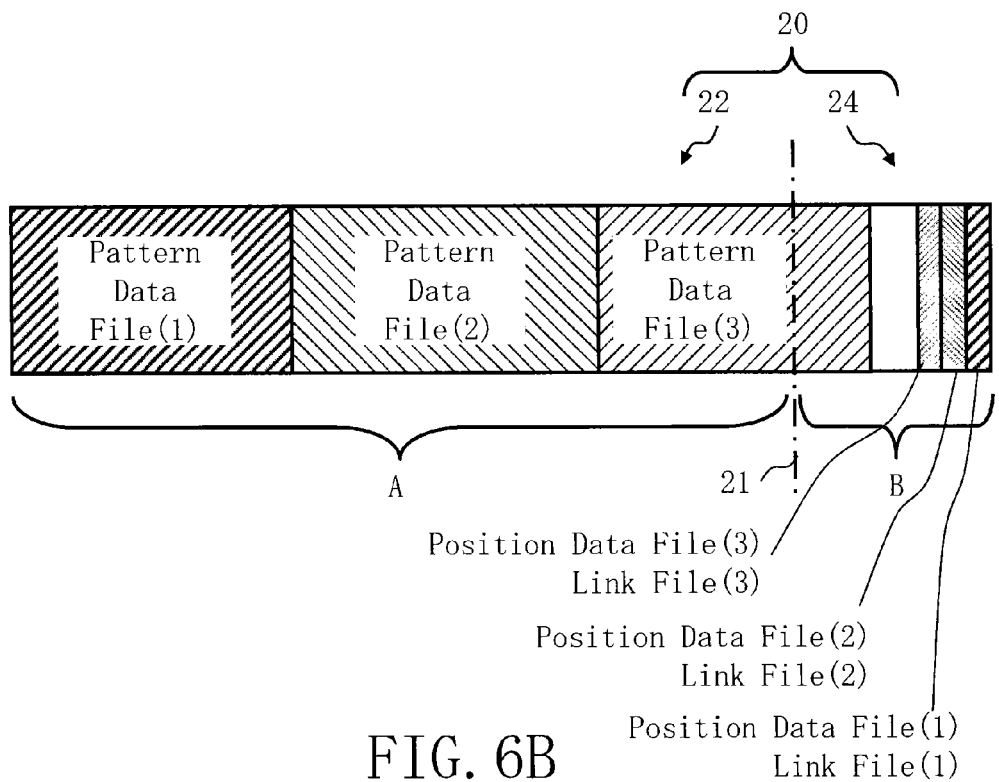

FIGS. 6A and 6B are shown for explaining a method of storing data into the buffer memory according to the first embodiment. As a comparative example, FIG. 6A shows the case in which the position data file (3) and the link file (3) of the third frame region 12 are stored in the large data size region 22 after the data files of the first and second frame regions 12 have been stored. In this case, it is difficult to store the cell pattern data file (3) of the third frame region 12. On the other hand, according to the first embodiment, it is possible to store the cell pattern data file (3) by the method of storing the position data file (2) and the link file (2), and further the position data file (3) of the third frame region 12 in order in the small data size region 24 commencing from the end side of the region 24 as shown in FIG. 6B. In that case, it is acceptable to store the cell pattern data file to be extended over the dividing position 21 to the small data size region 24 side from the large data size region 22.

In the data deletion step (S110), if it is impossible to acquire a continuous region, whose size is greater than or equal to the size necessary for storing a plurality of data files of the frame region 12 concerned, in a specified region in the buffer memory 114, the deletion unit 58 deletes an unnecessary data file, which has already been used, as needed in order commencing from a frame region 12 that was read early. For example, when reading the data file for the fourth frame region 12 in the case of FIG. 5, if a continuous region whose size is greater than or equal to the required size cannot be acquired due to a lack of region, the data file for the first frame region 12 is deleted first. If it is still impossible to acquire the continuous region, the data file for the second frame region 12 is deleted. According to the garbage collection function performed by a conventional OS, if the remaining amount of the memory is deficient, data for all the frame regions not being used at the time is deleted from the memory. Thereby, it takes an additional time to later re-read a data file which again becomes necessary. On the other hand, according to the first embodiment, an unnecessary data file which has already been used is deleted as needed in order commencing from the frame region 12 that was read early. Therefore, it is possible to avoid deleting data files more than necessary. Thus, the time to re-read a data file can be eliminated or reduced.

In the data conversion processing step (S112), for each frame region 12, the writing data processing unit 59 (data processing unit) reads a plurality of corresponding data files from the buffer memory 114, and performs data conversion processing (data processing) of a plurality of steps by using a plurality of the read data files. Then, apparatus-specific shot data is generated. With regard to a cell pattern, it is usually composed of a plurality of figure patterns. For writing a figure pattern by the writing apparatus 100, it needs to divide each figure pattern defined in the cell pattern data to be the size that can be irradiated by one beam shot. Thus, in order to actually perform writing, the writing data processing unit 59 divides each figure pattern into the size that can be irradiated by one beam shot so as to generate a shot figure. Shot data is generated for each shot figure. Figure data, such as a figure type, figure size, and irradiation position is defined in the shot data. The generated shot data is stored in the memory 142.

In the writing step (S114), the writing unit 150 writes a pattern on the target object 101 in accordance with the content of data having been processed, by using the electron beam 200 for each frame region 12. Specifically, it operates as follows.

The electron beam 200 emitted from the electron gun 201 (emission unit) irradiates the entire first aperture plate 203 having a quadrangular opening by the illumination lens 202. At this point, the electron beam 200 is shaped to a quadrangle. Then, after having passed through the first aperture plate 203, the electron beam 200 of a first aperture image is projected onto the second aperture plate 206 by the projection lens 204. The first aperture image on the second aperture plate 206 is deflection-controlled by the deflector 205 so as to change the shape and size of the beam to be variably shaped. After having passed through the second aperture plate 206, the electron beam 200 of a second aperture image is focused by the objective lens 207 and deflected by the main deflector 208 and the sub deflector 209, and reaches a desired position on the target object 101 on the XY stage 105 which moves continuously. FIG. 1 shows the case of using a multiple stage deflector of two stages of the main and sub deflectors for position deflection. In such a case, the main deflector 208 may deflect the electron beam 200 of the shot concerned to a reference position of a subfield (SF), which is obtained by further dividing the stripe region virtually, while following the stage movement, and the sub deflector 209 may deflect the beam of the shot concerned to each irradiation position in the SF.

Figure 7:
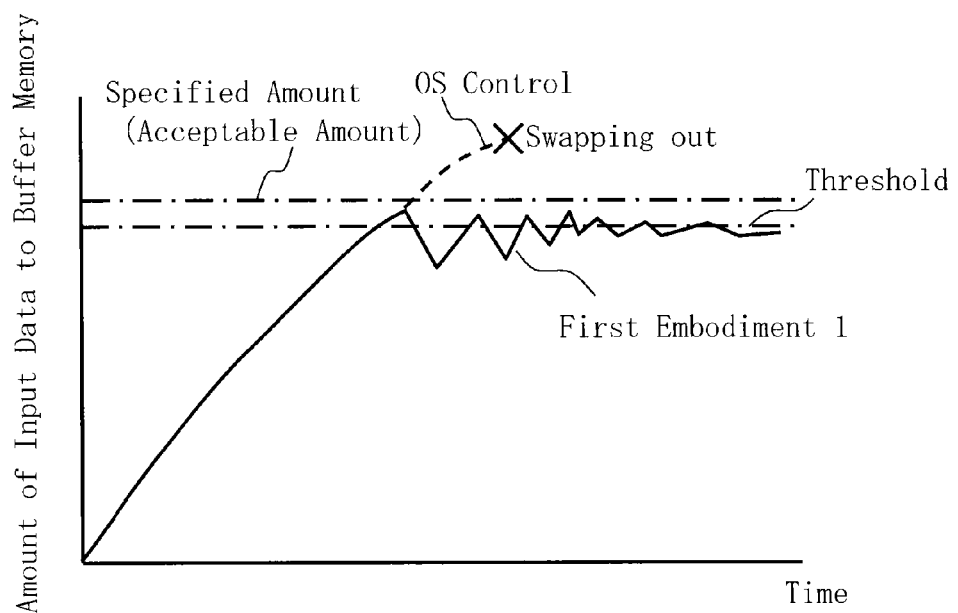
FIG. 7 is an example of a graph showing a relation between an input data amount and time of a buffer memory according to the first embodiment.

FIG. 7 is an example of a graph showing a relation between an input data amount and time of a buffer memory according to the first embodiment. In FIG. 7, the amount of input data of the buffer memory is represented by the ordinate axis and time is represented by the abscissa axis. In the case of memory control by a conventional OS, when data is read into the memory by the OS control, fragmentation may occur in the memory. Furthermore, if the memory capacity becomes insufficient, the OS performs a swap-out operation by using the hard disk etc. Thereby, when data conversion processing of writing data is performed in the system side, the data read-out time becomes long, which makes the data processing stopped temporarily. On the other hand, according to the first embodiment, since the memory control is performed in accordance with an actual memory region 20 of the buffer memory 114 in the control computer 110, it is possible to avoid producing fragmentation. Furthermore, according to the first embodiment, it is possible to avoid that the amount of input data exceeds a specified amount (acceptable amount) of the actual memory region 20 of the buffer memory 114. The usage rate of the buffer memory 114 according to the first embodiment fluctuates approximately between 80 and 90% Therefore, it is possible to avoid producing swapping out. Conseqently, when performing data conversion processing by the writing data pressing unit 59, data read-out can be completed in a short time, and therefore, stopping of data processing can be avoided. Data processing, which becomes time-out because read-out takes a long time due to swapping-out by a conventional method, can be actually executed according to the first embodiment.

As described above, according to the first embodiment, fragmentation and swapping-out in a memory can be inhibited. As a result, stopping (deadlock) of data processing itself can be avoided, thereby preventing stopping of writing processing.

Second Embodiment

In the first embodiment, the memory region 20 of the buffer memory 114 is divided into the large data size region 22 (A) and the small data size region 24 (B), and data files to be stored therein are distinguished from each other. On the other hand, in the second embodiment, a method that can suppress at least swapping out by a simpler method will be described. The structure of the writing apparatus according to the second embodiment is the same as that of FIG. 1 except that the dividing unit 50 and the region specifying unit 52 are unnecessary. The content of the second embodiment may be the same as that of the first embodiment except what is particularly described below.

Figure 8:
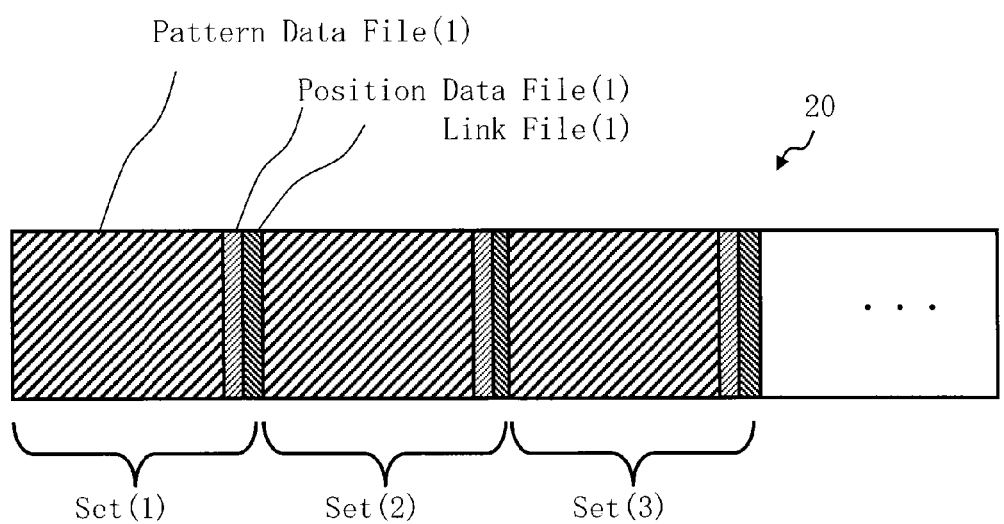
FIG. 8 is a conceptual diagram showing a memory region of a buffer memory according to the second embodiment.
Figure 9:
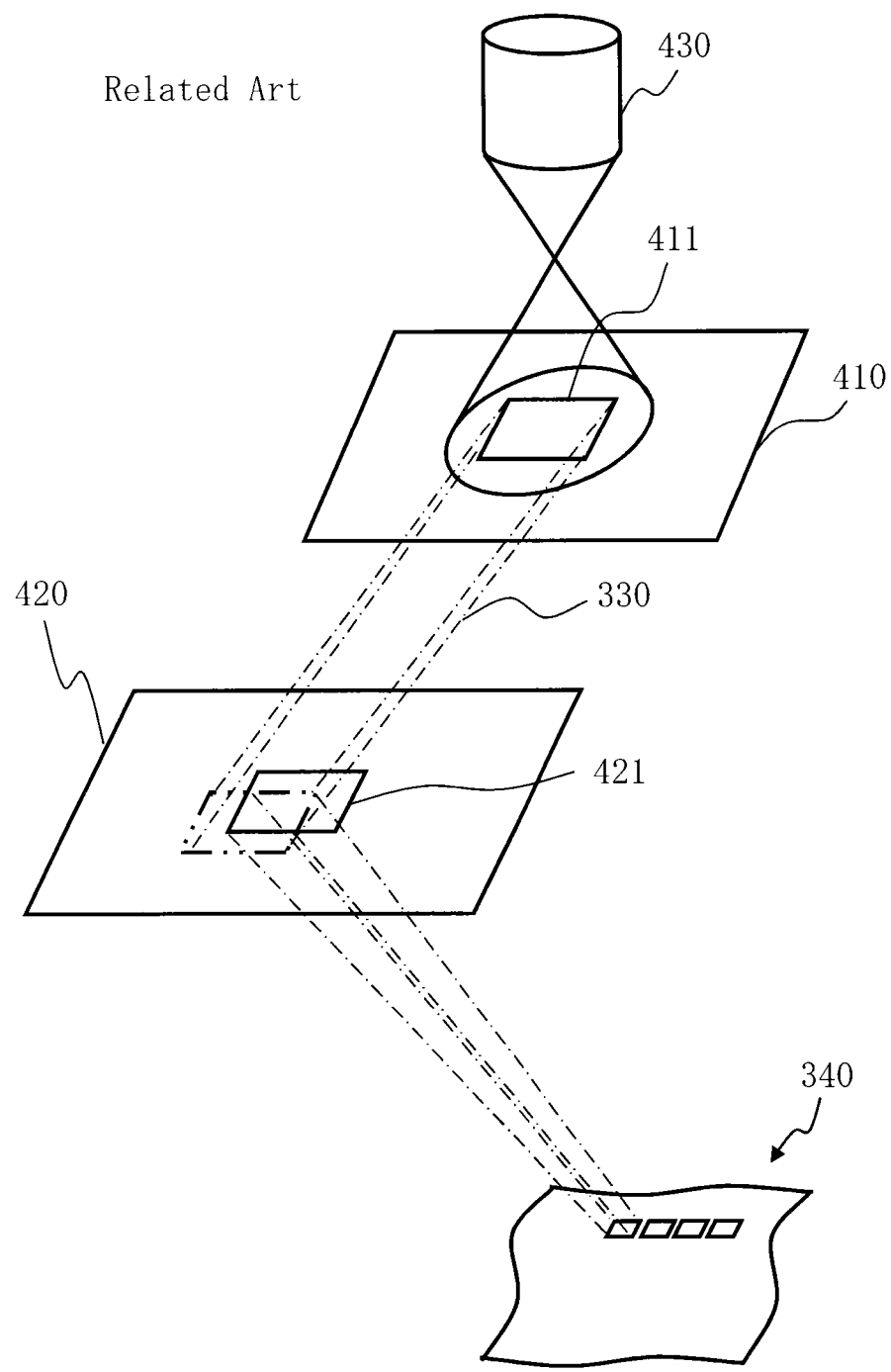
FIG. 9 is a conceptual diagram for explaining operations of a variable shaped electron beam writing apparatus.

FIG. 8 is a conceptual diagram showing a memory region of a buffer memory according to the second embodiment. The read unit 56 makes a set of data files (a cell pattern data file, a position data file, and a link file) for each frame region 12, and reads and stores it into the memory region 20 of the buffer memory 114. In the case of FIG. 8, the cell pattern data file (1), the position data file (1), and the link file (1) of the first frame region 12 are stored in order as a set (1) at the end side of the memory region 20. Then, next to the set (1), the cell pattern data file (2), the position data file (2), and the link file (2) of the second frame region 12 are stored as a set (2). Similarly, each set is stored in order.

The determination unit 54 determines whether it is possible to acquire a continuous region, whose size is greater than or equal to the size necessary for storing a plurality of data files of the frame region 12 concerned, in a specified region in the buffer memory 112. If the continuous region greater than or equal to the required size is insufficient, a set of unnecessary data files which have already been used is deleted by the deletion unit 58 as needed in order commencing from the frame region 12 that was read early. In the example of FIG. 8, if there is not sufficient remaining amount of the region for reading the data file set (4) of the fourth frame region 12, the data file set (1) for the first frame region 12 is deleted first. When the continuous region is still insufficient, the data file set (2) for the second frame region 12 is deleted. Data reading and data deleting are performed until it is determined by the determination unit 57 that data files for all the frame regions have been stored.

According to the second embodiment, since data files for the same frame region 12 are always stored and deleted as a set, it is possible to avoid storing at least one of the data files in a different region. Therefore, fragmentation hardly occurs. Moreover, since data exceeding a specified amount (acceptable amount) of the memory is not stored, it is also possible to avoid swapping out. Consequently, stopping of data processing can be avoided.

Embodiments have been explained referring to concrete examples as described above. However, the present invention is not limited to these specific examples.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other charged particle beam writing apparatus, writing method, and method of storing data in a buffer memory that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
   a buffer memory configured to include a memory region capable of contemporarily storing writing data for a plurality of data processing regions obtained by virtually dividing a writing region of a target object to be written using a charged particle beam, wherein writing data including a plurality of data files is temporarily stored for each of the plurality of data processing regions;
   a dividing unit configured to divide the memory region of the buffer memory into a first region whose region size is large and a second region whose region size is smaller than the region size of the first region;
   a region specifying unit configured to specify the memory region of the buffer memory wherein a data file in which pattern data of a cell pattern composed of at least one figure to be written on the target object using the charged particle beam is defined has priority to be stored in the first region and a data file in which position data indicating a position on the target object of writing the cell pattern using the charged particle beam is defined is stored at least in the second region, with respect to the plurality of data files for the each of the plurality of data processing regions included in the writing data;
   a data processing unit configured to read the plurality of data files corresponding to the each of the plurality of data processing regions from the buffer memory, and to perform data processing using the plurality of data files having been read; and
   a writing unit configured to write a pattern on the target object with charged particle beams, in accordance with content of the data processing, for the each of the plurality of data processing regions.

2. The apparatus according to claim 1, wherein a threshold value of the memory region for dividing the memory region into the first region and the second region is determined by using a ratio of file sizes of the plurality of data files.

3. The apparatus according to claim 1, wherein the memory region of the buffer memory is divided into two of the first region and the second region.

4. The apparatus according to claim 1, wherein a position data file in which position data indicating a position of a cell pattern composed of at least one figure is defined, a pattern data file in which pattern data of the cell pattern is defined, and a link file in which link information for linking the position data and the pattern data being corresponding to each other is defined are included in the plurality of data files.

5. The apparatus according to claim 1 further comprising:
   a first determination unit configured to determine, with respect to the each of the plurality of data processing regions, whether a continuous empty region whose size is greater than or equal to a size necessary for storing the plurality of data files for one of the plurality of data processing regions can be acquired in a specified memory region in the buffer memory.

6. The apparatus according to claim 5 further comprising:
   a read unit configured to, for the each of the plurality of data processing regions, respectively read and store the plurality of data files into a specified region in the memory region of the buffer memory.

7. The apparatus according to claim 6 further comprising:
   a second determination unit configured to determine whether storing file data has been completed with respect to all of the plurality of data processing regions.

8. The apparatus according to claim 7 further comprising:
   a deletion unit configured to delete an unnecessary data file which has already been used in the plurality of data files, as needed in order commencing from one of the plurality of data processing regions that was read early.

9. The apparatus according to claim 1, wherein a file size of the data file in which pattern data of the cell pattern composed of at least one figure to be written on the target object using the charged particle beam is greater than a file size of the data file in which position data indicating the position on the target object of writing the cell pattern using the charged particle beam.

10. A method of storing data in a buffer memory comprising:

dividing a memory region of a buffer memory, which can contemporarily store writing data for a plurality of data processing regions obtained by virtually dividing a writing region of a target object to be written using a charged particle beam, wherein writing data including a plurality of data files is temporarily stored for each of the plurality of data processing regions, into a first region whose region size is large and a second region whose region size is smaller than the region size of the first region;

specifying the memory region of the buffer memory such that a data file in which pattern data of a cell pattern composed of at least one figure to be written on the target object using the charged particle beam is defined has priority to be stored in the first region and a data file in which position data indicating a position on the target object of writing the cell pattern using the charged particle beam is defined is stored at least in the second region, with respect to the plurality of data files for the each of the plurality of data processing regions included in the writing data; and storing, for the each of the plurality of data processing regions, the plurality of data files respectively in a specified memory region in the memory region of the buffer memory.

11. The method according to claim 10 further comprising:

determining, with respect to the each of the plurality of data processing regions, whether a continuous empty region whose size is greater than or equal to a size necessary for storing the plurality of data files for one of the plurality of data processing regions can be acquired in the specified memory region in the buffer memory.

12. The method according to claim 10, wherein a file size of the data file in which pattern data of the cell pattern composed of at least one figure to be written on the target object using the charged particle beam is greater than a file size of the data file in which position data indicating the position on the target object of writing the cell pattern using the charged particle beam.

* * * * *